United States Patent [19]

Brinkman

[11] Patent Number: 4,852,096
[45] Date of Patent: Jul. 25, 1989

[54] $CN^2$ TEST PATTERN GENERATOR

[75] Inventor: Robert P. Brinkman, Irving, Tex.

[73] Assignee: International Business Machines Corp., Armonk, N.Y.

[21] Appl. No.: 85,108

[22] Filed: Aug. 14, 1987

[51] Int. Cl.$^4$ ............................................ G01R 31/28
[52] U.S. Cl. ......................................... 371/27; 371/21
[58] Field of Search ............................. 371/27, 21, 15; 324/73 R

[56] References Cited

U.S. PATENT DOCUMENTS

| 4,263,669 | 4/1981 | Staiger | 371/21 X |
| 4,429,389 | 1/1984 | Catiller | 371/27 X |
| 4,442,519 | 4/1984 | Jones | 371/27 |
| 4,754,215 | 6/1988 | Kawai | 371/27 X |
| 4,763,375 | 4/1988 | Tannhauser | 371/27 |

Primary Examiner—Joseph Ruggiero
Assistant Examiner—Robert W. Beausoliel
Attorney, Agent, or Firm—William T. Ellis

[57] ABSTRACT

A $CN^2$ memory testing circuit for generating a sequence of $C(N^2+1)$ memory addresses which will accomplish a $CN^2$ test with the least possible memory transitions. In one embodiment for an odd integer C, the mth bit in the memory address sequence comprises at least one repetition of a unique transition bit (UTB) pattern, where the UTB pattern comprises UTB Pattern=$(C+1)/2$ entries of 00, concatenated with $C-1$ entries of 10, concatenated with $(C+1)/2$ entries of 11, to yield the transitions 0-0, 0-1, 1-0, and 1-1. The m+1th bit in this memory address sequence comprises m+1th bit pattern=a plurality of different combinations of 00, 01, 10, and 11, in any order, but with each of the different bit combinations aligned, at least once, with each different transition in the UTB pattern.

A second embodiment, with an even integer C, is similar to the first embodiment, but with a UTB pattern comprising UTB pattern=$C(2)^{2m-1}$ entries of 00, concatenated with $C(2)^{2m-1}$ entries of 01, concatenated with $C(2)^{2m-1}$ entries of 10, concatenated with $C(2)^{2m-1}$ entries of 11.

19 Claims, 1 Drawing Sheet

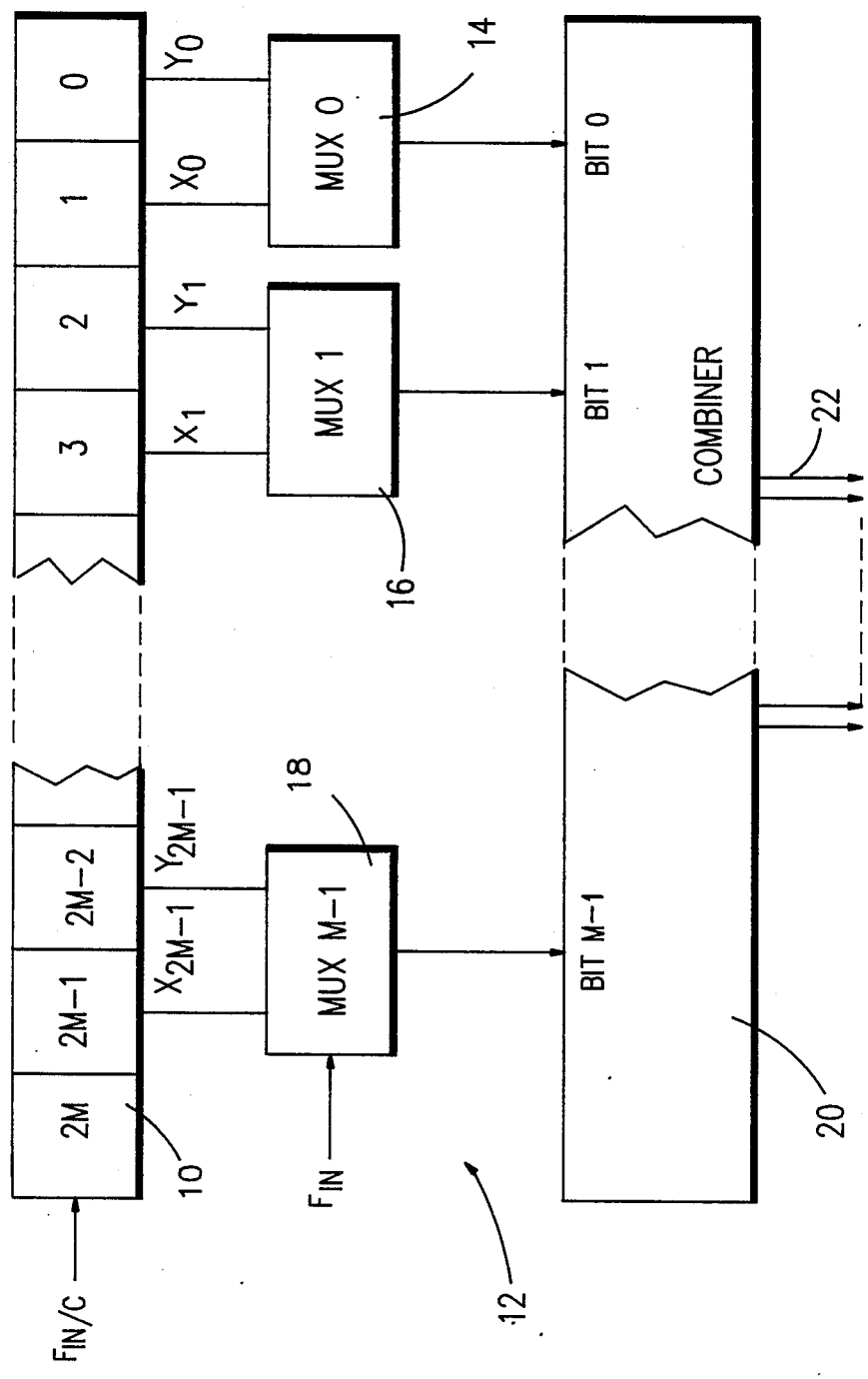

ABCDE

CN² TEST PATTERN GENERATOR

DESCRIPTION BACKGROUND OF THE INVENTION

The present invention relates generally to the field of semiconductor chip testing, and more particularly to a circuit for generating memory addresses for a CN² memory test (where C is the multicycle rate for the N² test and is an integer).

Semiconductor memory chips are commonly tested to determine the speed of access between different address locations in the memory. Each individual transition between address locations comprises the operation of de-selecting the current address location and selecting the new address location, and then measuring the time required for the data at this new memory address to appear at the memory output terminals. Such memory access timing is required for each possible memory address transition because a late transition of data to the memory outputs would cause the wrong data to be operated on in the system.

N² addressing is a preferred technique for testing memory transitions because it permits the characterization of the effects of each address on every other address in a memory array. The standard for generating this pattern has been to create a SCAN where all 'AWAY' addresses are tested to a fixed 'HOME' address. At the completion of this SCAN, a new 'HOME' address is selected and the procedure repeated until each address in the array has been the 'HOME' address. The address transitions required to generate such an N² pattern are illustrated in Table 1, where N is the number of addresses in the array. A SCAN appears as an entire row in this table and the entire table consists of N SCANS. By definition, an N² test requires N² distinct transition to occur. From Table 1, each transition requires 2 addresses. Consequently, the standard N² test requires 2N² memory cycles. However, the 2N² required memory cycles make the test time-consuming and inefficient.

The invention as claimed is intended to remedy this problem.

The advantage offered by the present invention is that it allows a 2N² memory test to be performed in N²+1 memory cycles, thereby significantly increasing the speed of the test. A further advantage offered by the present invention is that it can be implemented in hardware, eliminating the need for buffer storage of the memory address sequence. A yet further advantage of the present invention is that the address generation hardware can be placed directly on a semiconductor chip.

SUMMARY OF THE INVENTION

Briefly, the present invention is a CN² memory testing circuit comprising:
 counter means with at least M register stages, stepped at a frequency $F_{in}$, for generating M bit patterns in the M register stages, of N²+1 bits each;
 means for concurrently sampling each of the M bit patterns at a sampling frequency of $F_{in}/C$, where C is the multi-cycle coefficient and is an integer;
 means for combining the bit patterns to form N²+1 consecutive memory addresses, of M bits each, to perform CN² memory testing; and means for applying the consecutive memory addresses to the address input of a memory to facilitate complete CN² testing.

In a further embodiment of the present invention, the CN² memory testing apparatus comprises
 means for generating CN² consecutive binary memory addresses, with each memory address having M bits, with the consecutive listing of the same one of those bits in each consecutive generated address yielding an mth bit pattern or its complement, with the mth bit pattern comprising at least one repetition of a unique transition bit (UTB) pattern, wherein the UTB pattern comprises
  UTB pattern =(C+1)/2 entries of 00, concatenated with C−1 entries of 10, concatenated with (C+1)/2 entries of 11, to yield the transitions 0-0, 0-1, 1-0, and 1-1,
  where C is the multi-cycle coefficient and is an odd integer, and with the consecutive listing of the m+1th bit in each consecutive generated memory address yielding an m+1th bit pattern or its complement, wherein the m+1th bit pattern comprises
  m+1th bit pattern =a plurality of different combinations of 00, 01, 10, and 11, in any order, but with each of the different bit combinations aligned, at least once, with each different transition in the UTB pattern, where m=0, 1, ... M−1; and
 means for applying the generated series of memory addresses to the address inputs of a memory.

In yet a further embodiment, the CN² memory testing apparatus comprises
 means for generating N² consecutive binary memory addresses with each memory address having M bits, with the consecutive listing of the mth bit in each memory address of M bits yielding and mth bit pattern or its complement, comprising at least one repetition of a unique transition bit (UTB) pattern, wherein the UTB pattern comprises
  UTB pattern=$C(2)^{2m-1}$ entries of 00, concatenated with $C(2)^{2m-1}$ entries of 01, concatenated with $C(2)^{2m-1}$ entries of 10, concatenated with $C(2)^{2m-1}$ entries of 11, to yield the transitions 0-0, 0-1, 1-0, and 1-1;
  where m=0, 1, ... M−1, and C is the multi-cycle cofficient and is an even integer, and with the consecutive listing of the m+1th bit in each consecutive generated memory address yielding an m+1th bit pattern or its complement, wherein the m+1th bit pattern comprises
  m+1th bit pattern=a plurality of different combinations of 00, 01, 10, and 11, in any order, but with each of the different bit combinations aligned, at least once, with each different transition in the UTB pattern; and
 means for applying the generated series of memory addresses to the address inputs of a memory.

The present invention further includes the method of generating addresses to facilitate CN² memory testing.

In essence, the invention permits a specific memory testing on each memory transition.

BRIEF DESCRIPTION OF THE DRAWINGS

The FIGURE is a schematic block diagram of one embodiment of the present invention.

DETAILED DESCRIPTION OF THE PREFERRED EMBODIMENT

The present invention is directed to a unique apparatus for generating a sequence of memory addresses which will facilitate a $CN^2$ memory test with the least possible number of memory cycles. For example, a $1N^2$ test requires a transition from each memory address to every other memory address. The present invention permits this one $N^2$ memory test by means of $N^2$ distinct memory transition, but requiring only $N^2+1$ modes or memory cycles, i.e., a testing on each memory transition.

In a standard binary memory system, there are two states (0 and 1) for each memory bit. Accordingly, there exist only 4 possible transitions between these two states; namely 0-0, 1-0, 0-1, and 1-1.

There are a variety of different circuit configurations which may be utilized in order to implement the present invention. One such configuration is shown in the attached FIGURE. This configuration comprises counter means 10 with at least 2M register stages, stepped at a frequency $F_{in}/C$, for generating M bit patterns in the 2M register stages, of $C(N^2+1)$ bits each. The configuration further includes means 12 for providing the M bit pattern by concurrently sampling each of the 2M bit patterns at a sampling frequency of $F_{in}$. In the embodiment illustrated in the FIGURE, the means for sampling 12 is shown to include the multiplexers 14, 16, and 18. Each multiplexer is shown to include an X input from one register stage, and a Y input from the adjacent right register stage. The configuration further includes means 20 for combining the bit patterns from the sampling means 12 to form $C(N^2+1)$ consecutive addresses of M bits each, to perform complete $CN^2$ memory testing, in combination with means 22 for applying the consecutive memory addresses from the combining means 12 to the address inputs of a memory to facilitate the $CN^2$ testing.

In one embodiment of the present invention with $C=1$, the counter means 10 includes 2M register stages, and the sampling means 12 selectively samples the 2M register stages to obtain an mth bit pattern or its complement, comprising at least one repetition of a unique transition bit (UTB) pattern, wherein the UTB pattern comprises UTB pattern = 1 entry of 00, concatenated with 1 entry of 11, to yield the transitions 0-0, 0-1, 1-0, and 1-1.

The sampling means 12 further samples the 2M register stages to obtain an m+1th bit pattern, comprising m+1th bit pattern = a plurality of different combinations of 00, 01, 10, and 11, in any order, but with each of the different bit combinations aligned, at least once, with each different transition in the UTB pattern.

Using the configuration shown in the FIGURE, the UTB pattern may be obtained, for example, for the 0 bit in the memory address, and assuming that $C=1$, by sampling the number 1 register stage in the counter 10. This implementation may be accomplished by programming the multiplexer 14 to sample only its $X_0$ input at the counter frequency $F_{in}$, where $F_{in}$ is the frequency at which the memory is being tested. The other higher order bits in the memory address may be obtained by any one of a variety of sampling techniques. For example, each one of the multiplexers 16 and 18 can alternately sample their X input, and then their Y input, or vice versa, in order to obtain their respective bit patterns. Table 2 shows the resulting bit pattern from the FIGURE for bits 0 and 1, based on the parameters $C=1$, $M=2$, and $N=4$.

Referring to Table 2, it can be seen that each row of numbers constitutes a particular memory address, while each column of bits in this sequence of memory addresses comprises one or more repetitions of a unique transition bit (UTB) pattern. It can be seen that there are M columns representing the M bit memory address, and $N^2+1$ rows. The unique transition bit pattern for bit 0, $UTB_0$, includes the transition 0-0, referred to as the A transition, the transition 0-1, referred to as the B transition; 1-1, referred to as the D transition; and 1-0, referred to as the C transition. If each memory address constituted only a single bit 0, then the $N^2$ test ($C=1$) would simply comprise the bit sequence 00110. As each additional bit is added to the memory address, that additional bit will comprise a plurality of combinations of 00, 01, 10, and 11, in any order, but with each of these different bit combinations aligned, at least once, with each different transition in the UTB pattern for the preceding bit. This additional memory bit will then constitute a UTB pattern for the next memory bit succeeding it. It can be seen that in order to permit the different combinations in the m+1th bit pattern to align, at least once, with each entry in the UTB pattern for the mth bit, the UTB pattern for the mth bit must be repeated 4 times. This is shown in Table 2 for the bit 0. Likewise, the $UTB_1$ for bit 1 is repeated 4 times in order to permit the different combinations of 00, 01, 10, and 11 in bit 2 to align at least once, with each different transition in the $UTB_1$ pattern.

In general, as the bit weight in the memory address increases, the length of the UTB pattern, or the column depth in the memory address matrix, increases on the basis of a repetition factor which is equal to $R=4^{(M-(1+m))}$, where $m=0, 1, \ldots M-1$. It can be seen that the length of the $M-1$ UTB pattern is equal to $N^2$, which causes $N^2$ transitions and then loops the algorithm back to the first matrix entry.

Note that the counter means 10 is typically initialized to zero prior to the $CN^2$ address generation. In the above-described example for a $1N^2$ test, the test is completed when the 0 and the 2M stages are set. The combiner block 20 may be realized by appropriate wiring and/or gates to obtain the signals for the entire address, or by a function selector device.

It can be seen that the length of each UTB pattern for a particular bit weight, is always 4 times the length of the UTB pattern for the bit weight of one less order. Also, it can be seen that each UTB pattern is weighted with an equal quantity of each type of bit combination or transition, i.e., 00 (designated the A transition), 01 (designated the B transition), 10 (designated the C transition), and 11 (designated the D transition). This point is illustrated by reviewing bit 1 in Table 2. It can be seen that bit 1 includes each of the transitions A, B, C and D four times, and that the length of the UTB is 4 times the length of the UTB pattern for bit 0. To reiterate, when the UTB pattern for bit 0 is generated, each of the 4 different transitions, A,B,C, and D occurs once and the $UTB_0$ pattern is of length 4 transitions. The next higher bit 1 generates its own $UTB_1$ pattern and contains each different transition A,B,C, and D, 4 times. Accordingly, since the length of bit one's $UTB_1$ is 4 times the length of the bit 0's $UTB_0$ pattern, the bit zero $UTB_0$ pattern must be repeated 4 times. As this repetition occurs, all 4 types of the different transitions in the bit 1 UTB$_1$ pattern are aligned with each position in bit zero's UTB$_0$ pattern, therefore generating an N$^2$ test. In essence, each different transition A, B, C, and D in the given higher order bit has been aligned with all of the combinations of the different transitions A,B,C, and D in the next lower order bit.

Table 3 illustrates how bits 1 and 0 in Table 2 may be viewed in terms of a correlation matrix. The dimensions of this correlation matrix will always be 4 rows for the 4 different transitions A, B, C, and D in the higher order bit, by 4$^{(M-1)}$ transition letter columns, with the length of the given UTB pattern generated by the lower order bit. It can be seen that the sequence of different transitions within the higher order bit m+1 UTB$_1$ pattern exhibits a constant pattern. This can be seen in Table 3 by looking down the vertical letter columns representing the transitions in the higher order bits UTB pattern. It can be seen that odd positions in the letter transition columns, i.e., the first and third letter columns, in the lower order bit m's UTB$_m$ pattern, always align with the transition A, then the transition B, then the transition C, and finally the transition D. The even letter positions in this lower order bit align with the transition A, then the transition C, then the transition B, and finally the transition D, except for the very last position. The alignment here occurs with transition A, then transition D, then transition B, and finally transition C. It should be noted that in all cases, the different transitions for the higher order bit m+1 occur and align with each position in the lower order bits UTB pattern, thus generating an N$^2$ pattern.

The same type of correlation matrix can be used as each higher order bit is added to thereby maintain the N$^2$ pattern generation. Table 4 illustrates this correlation matrix for a higher order bit m+2. Again, in order to generate an N$^2$ test pattern, each different transition in the UTB pattern for the lower order bit m+1, must align with each different bit combination or transition A, B, C, or D in the higher order bit, m+2. Again, the higher order bit's UTB pattern exhibits a constant pattern. This is seen by looking down the vertical letter entries for the odd letter columns in the higher order bit's UTB pattern. Each odd letter position in the lower order bit's unique transition bit pattern aligns with the transition A, then the transition B, then the transition C, and finally the transition D in the higher order bit. Again, the even letter positions in the lower order bit align with the transition A, then the transition C, then the transition B, and finally the transition D, except for the very last position.

The memory address matrix shown in Table 2 illustrates a matrix for a 1N$^2$ test. The present invention is also capable of producing multi-cycle CN$^2$ testing. In this regard, for a multi-cycle coefficient C which is an odd integer, the previously recited equation may be utilized with C equal to the odd integer.

In order to implement the apparatus of the present invention for multi-cycle coefficients which are even integers, the sampling means 12 may be arranged to selectively sample the register stages of the counter 10 to obtain an mth bit pattern or its complement comprising at least one repetition of a unique transition bit (UTB) pattern, and to obtain an m+1th bit, where the UTB pattern comprises UTB pattern=C(2)$^{2m-1}$ entries of 00, concatenated with C(2)$^{2m-1}$ entries of 01, concatenated with C(2)$^{2m-1}$ entries of 10, concatenated with C(2)$^{2m-1}$ entries of 11, to yield the transitions 0-0, 0-1, 1-0, and 1-1, where m =0, 1, ... M−1, and C is the multi-cycle coefficient and is an even integer;

and wherein the m+1th bit pattern comprises m+1th bit pattern=a plurality of different bit combinations 00, 01, 10, and 11, in any order, but with each of the different bit combinations aligned, at least once, with each different transition in the UTB pattern.

In this embodiment, with C equal to an even integer, the apparatus may be implemented with a counter with a series of registers 0 to 2M, which are stepped at a frequency of F$_{in}$/C. The sampling means 12 is set to alternately sample the value in one of an even or an adjacent odd register stage, and then to sample the value in the other of the even or the odd register stage. In the FIGURE, the multiplexer 14 is connected to register stage 1 and register stage 0 by means of the lines X$_0$ and Y$_0$, respectively. Likewise, the multiplexer 16 is connected to the register stage 3 and the register stage 2 by means of the lines X$_1$ and Y$_1$, respectively. Finally, the multiplexer 18 is connected to the register stage 2M−1 and 2M−2 by means of the lines X$_{2M-1}$ and Y$_{2M-1}$, respectively. The multiplexers in this embodiment are set to sample in unison, either all of the X lines first or all of the Y lines first, and then to alternately sample between these two lines. The sampling for these multiplexers is performed at module C. Accordingly, for a C=2 test, the sampling rate would be at module 2.

A Table 5 illustrates possible implementations of the present invention for C=1, 2, and 4. For each of these CN$^2$ tests, the required counter frequency, the multiplexer sampling for the bit 0, the point when the algorithm is finished, and the sampling rate is shown in the Table.

TABLE 1

N$^2$ ADDRESS TRANSITION TABLE

| HOME ADDRESS | AWAY ADDRESS | | | | | | | |
|---|---|---|---|---|---|---|---|---|
| | 0 | 1 | 2 | | | | N-1 | N |
| 0 | 0-0 | 1→0 | 2→0 | | | | | N→0 |
| 1 | 0→1 | 1→1 | 2→1 | | | | | N→1 |
| 2 | 0→2 | 1→2 | 2→2 | | | | | N→2 |
| | | | | | | | | |
| | | | | | | | | |

TABLE 1-continued
$N^2$ ADDRESS TRANSITION TABLE

| | | | | | | | | |
|---|---|---|---|---|---|---|---|---|
| | | | | | | | | |
| | | | | | | | | |
| 0→N-1 | 1→N-1 | | | | | | | N→N-1 |
| 0→N | 1→N | | | | | | | N→N |

TABLE 2

| | Bit 2 | Bit 1 | Bit 0 | |
|---|---|---|---|---|
| | | 0 | 0— | (C = 1) |
| | A— | | —A | (M = 2) |
| | | 0 | 0 | (N = 4) |
| | A— | | —B | $N^2 + 1 =$ memory states |
| | | 0 | 1 | |
| | A— | | —D | $UTB_0$ |
| | | 0 | 1 | |
| | A— | | —C | |
| | | 0 | 0— | |
| | B— | | —A | |
| | | 1 | 0 | |
| | C— | | B | $UTB_0$ |
| | | 0 | 1 | |
| | B— | | D | |
| $UTB_1$ | | 1 | 1 | |
| | D— | | C— | |
| | | 1 | 0 | |
| | C— | | —A | |
| | | 0 | 0 | |
| | B— | | $UTB_0$ | |
| | | 1 | 1 | |
| | C— | | | |
| | | 0 | 1 | |
| | B— | | — | |
| | | 1 | 0 | |
| | D— | | —A | |
| | | 1 | 0 | |
| | D— | | $UTB_0$ | |
| | | 1 | 1 | |
| | D— | | | |
| | | 1 | 1 | |
| | C— | | — | |
| | — | 0 | 0 | |

TABLE 3

| | | A A A A |
|---|---|---|
| $UTB_1$ | BIT 1 | 0-0-0-0 |
| | | B C B D |
| | | 0-1-0-1-1 |
| | | C B C B |
| | | 1-0-1-0-1 |
| | | D D D C |
| | | 1-1-1-1-0 |
| | | A B D C |
| $UTB_O$ | BIT 0 | 0-0-1-1-0 |

TABLE 4

| Bit m + 2 | A A A A | | A A A A A A A A |
|---|---|---|---|
| | 0-0-0-0-0-0 | ... | 0-0-0-0-0-0-0-0-0 |
| | B C B B | | C B B B D |
| | 0-1-0-1-0-1-0 | ... | 1-0-1-0-1-0-1-0-1-1 |
| | C B C C | | B C B C B C B C B |
| | 1-0-1-0-1-0-1 | ... | 0-1-0-1-0-1-0-1-0-1 |
| | D D D D | | D D D D B |
| | 1-1-1-1-1-1 | ... | 1-1-1-1-1-1-1-1-0 |
| Bit m + 1 | A...A | B...B | C...C D...D A |

TABLE 4-continued

| $UTB_m + 1$ | 0-0 | 0-0-0-1 | 0-1-1-0 | 1-0-1-1 | 1-1-0-0 |
|---|---|---|---|---|---|

TABLE 5

| TEST | $N^2$ | $2N^2$ |
|---|---|---|
| COUNTER FREQUENCY | $F_{IN}$ | $F_{IN/2}$ |
| MUX 0 | A ONLY COUNTER | A-B |
| ALGORITHM FINISHED | BIT 2M AND 0 SET | BIT 2M SET |
| SAMPLE RATES | $F_{IN}$ | MODULO 2 |

Note that hardware changes for different multi-cycle coefficients, C, involve in most cases, only a change in frequency for stepping the counter and a change in the control at the multiplexer on the LSB of the counter.

The present invention describes an apparatus for permitting a $CN^2$ test wherein a specific testing occurs on each memory transition, in contrast to the prior art. This testing permits a $CN^2$ pattern to be generated in approximately one-half the number of cycles that prior art techniques require. Additionally, the present apparatus may be easily implemented on the actual memory chip to be tested, making the test more reliable.

Finally, it should be noted that the present invention could be implemented by means of a series of buffer registers to hold the different memory address bit strings, in place of the counter and multiplexers.

While the present invention has been particularly shown and described with reference to the preferred embodiments therefor, it will be understood by those skilled in the art that the foregoing and other changes in form and detail may be made therein without departing from the spirit and the scope of the present invention, as defined in the appended claims.

I claim:
1. A $CN^2$ memory testing circuit comprising:
   counter means with at least M register stages, stepped at a frequency $F_{in}/C$, for generating M bit patterns in said M register stages, of $N^2+1$ bits each, where C is the multi-cycle coefficient and is an integer;
   means for concurrently sampling each of said M bit patterns at a sampling frequency of $F_{in}$;
   means for combining said bit patterns to form $N^2+1$ consecutive memory addresses of M bits each to perform complete $CN^2$ memory testing; and
   means for applying said consecutive memory addresses to the address inputs of a memory to facilitate $CN^2$ testing.

2. A CN² testing apparatus as defined in claim 1, wherein said counter means includes 2M register stages; and wherein said sampling means includes means for selectively sampling said register stages to obtain one bit pattern comprising alternate bit combinations of 00 and 11, to yield the transitions 0-0, 0-1, 1-0, and 1-1, and to obtain a second bit pattern comprising the different bit combinations 00, 01, 10, and 11, in any order, but with each of said different bit combinations aligned at least once, with each different transition in said first bit pattern.

3. A CN² testing apparatus as defined in claim 1, wherein said counter means includes at least 2M register stages; and wherein said sampling means includes means for selectively sampling said 2M register stages to obtain an mth bit pattern or its complement, comprising at least one repetition of a unique transition bit (UTB) pattern, and to obtain an m+1th bit pattern, wherein said UTB pattern comprises UTB pattern=(C+1)/2 entries of 00, concatenated with C−1 entries of 10, concatenated with (C+1)/2 entries of 11, to yield the transitions 0-0, 0-1, 1-0, and 1-1, where C is an odd integer, m+1th bit pattern=a plurality of different combinations of 00, 01, 10, and 11, in any order, but with each of said different bit combinations aligned, at least once, with each different transition in said UTB pattern.

4. A CN² testing apparatus as defined in claim 1, wherein said counter means includes at least 2M register stages; and wherein said sampling means includes means for selectively sampling said register stages to obtain an mth bit pattern or its complement comprising at least one repetition of a unique transition bit (UTB) pattern, and to obtain an m+1th bit, wherein said UTB pattern comprises UTB pattern=$C(2)^{2m-1}$ entries of 00, concatenated with $C(2)^{2m-1}$ entries of 01, concatenated with $C(2)^{2m-1}$ entries of 10, concatenated with $C(2)^{2m-1}$ entries of 11, to yield the transitions 0-0, 0-1, 1-0, and 1-1, where m=0, 1, ... M−1, and C is the multi-cycle coefficient and is an even integer; and m+1th bit pattern=a plurality of the different bit combinations 00, 01, 10, and 11, in any order, with each of said different bit combinations aligned with each different transition in said UTB pattern.

5. An N² memory testing apparatus, comprising:

means for generating a first bit pattern comprising alternate bit combinations of 00 and 11, beginning at any point in the pattern, to yield the transitions 0-0, 0-1, 1-0, and 1-1;

means for generating a second bit pattern comprising the different bit combinations 00, 01, 10, and 11, in any order, but with each of said different bit combinations aligned in time at least once, with each different transition in said first bit pattern, means for forming N² consecutive binary memory addresses of M bits each, with said first bit pattern comprising an arbitrary mth significance bit in said N² consecutive addresses, and with said m+1th bit pattern comprising an arbitrary m+1th significance bit in said N² consecutive addresses; and means for applying said generated series of memory addresses to a memory.

6. An apparatus as defined in claim 5, wherein said first and second bit generating means comprise counting means including a series of register stages stepped at a frequency $F_{in}$, with one of said register stages generating said first bit pattern, and with one or more other of said register stages generating said second bit pattern.

7. An apparatus as defined in claim 6, wherein said address forming means comprises means for sampling said register stages to generate said M bit memory addresses.

8. An apparatus as defined in claim 7, wherein said memory address generating means comprises:

counter means with a series of register stages 0 to 2M, stepped at a frequency $F_{in}$, means for sampling at said frequency $F_{in}$ the register stage 1 to obtain said first bit pattern, and for sampling at said frequency $F_{in}$ the register stage 3 to obtain said second bit pattern.

9. A CN² memory testing apparatus, comprising:

means for generating CN² consecutive binary memory addresses, with each memory address having M bits, with the consecutive listing of the same one of those bits in each consecutive generated address yielding an mth bit pattern or its complement, with said mth bit pattern comprising at least one repetition of a unique transition bit (UTB) pattern, wherein the UTB pattern comprises UTB pattern=(C+1)/2 entries of 00, concatenated with C−1 entries of 10, concatenated with (C+1)/2 entries of 11, to yield the transitions 0-0, 0-1, 1-0, and 1-1, where C is the multi-cycle coefficient and is an odd integer, and with the consecutive listing of the m+1th bit in each consecutive generated memory address yielding an m+1th bit pattern or its complement, wherein the m+1th bit pattern comprises m+1th Bit Pattern=a plurality of different combinations of 00, 01, 10, and 11, in any order, but with each of said different bit combinations aligned, at least once, with each different transition in said UTB pattern, where m=0, 1, ... M−1; and means for applying said generated series of memory addresses to the address inputs of a memory.

10. A CN² memory testing apparatus as defined in claim 9, wherein said memory address generating means comprises counter means with a series of register stages 0 to 2M, stepped at a frequency $F_{in}/C$;

means for obtaining an m=0 bit pattern from the register stage one, and for obtaining a plurality of different second bit patterns from different respective odd register stages; and means for combining said bit patterns to form memory addresses of M bits each.

11. A CN² memory testing apparatus, comprising:

means for generating CN² consecutive binary memory addresses, with each memory address having M bits, with the consecutive listing of the mth bit in each memory address of M bits yielding an mth bit pattern or its complement, comprising at least one repetition of a unique transition bit (UTB) pattern, wherein said UTB pattern comprises UTB pattern=$C(2)^{2m-1}$ entries of 00, concatenated with $C(2)^{2m-1}$) entries of 01, concatenated with $C(2)^{2m-1}$ entries of 10, concatenated with $C(2)^{2m-1}$ entries of 11, to yield the transitions 0-0, 0-1, 1-0, and 1-1, where $m = 0, 1, \ldots M-1$, and C is the multi-cycle coefficient and is an even integer, and with the consecutive listing of the m+1th bit in each consecutive generated memory address yielding an m+1th bit pattern or its complement, wherein the m+1th bit pattern comprises m+1th bit pattern = a plurality of different combinations of 00, 01, 10, and 11, in any order, but with each of said different bit combinations aligned, at least once, with each different transition in said UTB pattern; and means for applying said generated series of memory addresses to the address inputs of a memory.

12. A $CN^2$ memory testing apparatus as defined in claim 11, wherein said memory address generating means comprises counter means with a series of register stages 0 to 2M, stepped at a frequency, $F_{in}/C$; and means for generating each bit pattern by alternately sampling the value in one of an even or an adjacent odd register stage, and then sampling the value in the other of the even or the odd register stage; and means for combining said bit patterns to form memory addresses of M bits each.

13. A method for generating addresses to facilitate $N^2$ memory testing, comprising generating an mth bit pattern comprising alternate bit combinations of 00 and 11, beginning at any point in the pattern, to yield the transitions 0-0, 0-1, 1-0, and 1-1;

generating an m+1th bit pattern comprising a plurality of different bit combinations 00, 01, 10, and 11, in any order, but with each of said different bit combinations aligned at least once, with each different transition in said mth bit pattern, forming $N^2$ consecutive binary memory addresses of M bits each, with said mth bit pattern comprising an arbitrary significance bit in said $N^2$ consecutive addresses, and with said m+1th bit pattern comprising the next higher significance bit from said mth bit in said $N^2$ consecutive addresses; and applying said generated series of memory addresses to a memory.

14. A method as defined in claim 13, wherein said mth and m+1th bit pattern generating steps comprise:

stepping a multi-stage counter; and sampling different stages in said counter to obtain said first and second bit patterns.

15. A method as defined in claim 14, wherein for a counter with stages 0 to 2M stepped at a frequency $F_{in}$, said sampling step includes the step of sampling at said frequency $F_{in}$ the register stage 1 to obtain said mth bit pattern, and for sampling at said frequency $F_{in}$ the register stage 3 to obtain said m+1th bit pattern.

16. A method for generating addresses to facilitate $CN^2$ memory testing, where C is the multi-cycle coefficient and is an odd integer, comprising the steps of:

generating M bit patterns, with an mth bit pattern or its complement comprising at least one repetition of a unique transition bit (UTB) pattern, wherein said UTB pattern comprises UTB pattern = $(C+1)/2$ entries of 00, concatenated with $C-1$ entries of 10, concatenated with $(C+1)/2$ entries of 11, to yield the transitions 0-0, 0-1, 1-0, and 1-1, and with an m+1th bit pattern comprising m+1th bit pattern = a plurality of different combinations of 00, 01, 10, and 11, in any order, but with each of said different bit combinations aligned with each different transition in said UTB pattern;

combining said M bit patterns to form $CN^2$ consecutive binary memory addresses, of M bits each; and applying said consecutive memory addresses to the address inputs of a memory.

17. A method as defined in claim 16, wherein said bit pattern generating step comprises the step of concurrently sampling odd register stages in at least a 2M stage counter stepped at a frequency $F_{in}$, with a sampling frequency of $F_{in}/C$.

18. A method for generating addresses to facilitate $CN^2$ memory testing, where C is the multi-cycle coefficient and is an even integer, comprising the steps of:

generating M bit patterns, with the mth bit pattern or its complement comprising at least one repetition of a unique transition bit (UTB) pattern, where the UTB pattern comprises UTB Pattern = $C(2)^{2m-1}$ entries of 00, concatenated with $C(2)^{2m-1}$ entries of 01, concatenated with $C(2)^{2m-1}$ entries of 10, concatenated with $C(2)^{2m-1}$ entries of 11, to yield the transitions 0-0, 0-1, 1-0, and 1-1, where $m = 0, 1, \ldots M-1$, and;

with the m+1th bit comprising m+1th bit pattern = a plurality of different combinations of 00, 01, 10, and 11, in any order, but with each of said different bit combinations aligned, with each different transition in said UTB pattern;

combining said M bit patterns to form $CN^2$ consecutive binary memory addresses, of M bits each; and applying said consecutive memory addresses to the address inputs of a memory.

19. A $CN^2$ memory testing apparatus as defined in claim 18, wherein said bit pattern generating step comprises the step of:

generating said mth bit pattern by alternately sampling the value in an even register stage of a 2M stage counter stepped at a frequency $F_{in}/C$, and then sampling the value in the next higher numbered-odd register stage thereof, with the sampling frequency being $F_{in}/C$.

* * * * *